United States Patent [19]

Shevakin et al.

[11] 4,119,135

[45] Oct. 10, 1978

[54] METHOD OF PRODUCING FOIL IN COILS

[76] Inventors: Jury Fedorovich Shevakin, Telegrafny pereulok, 11/16, kv. 53; Leonid Pavlovich Seleznev, ulitsa Ostrovityanova, 21, kv. 69; Igor Iosifovich Dobkin, 2 Avtozavodsky proezd, 5, korpus 1, kv. 6; Vladislav Alexandrovich Vasiliev, ulitsa Polotskaya, 10, kv. 53; Ljudmila Dmitrievna Kharitonova, Suvorovsky bulvar, 25, kv. 19; Grigory Ilich Kandyba, ulitsa Volgina, 25, korpus 3, kv. 101; Nikolai Igorevich Parshin, I Ozerkovsky pereulok, 2/16, kv. 11, all of Moscow, U.S.S.R.

[21] Appl. No.: 798,388

[22] Filed: May 19, 1977

[51] Int. Cl.$^2$ .................................. B22D 45/00
[52] U.S. Cl. ................................ 164/46; 164/75; 264/81; 204/13
[58] Field of Search ........... 164/46, 75, 19; 264/81, 264/169, 213, 130, 5, 309; 204/12, 13

[56] References Cited

FOREIGN PATENT DOCUMENTS 1,143,077  1/1963  Fed. Rep. of Germany ............ 164/46

Primary Examiner—Francis S. Husar
Assistant Examiner—K. Y. Lin
Attorney, Agent, or Firm—Steinberg & Blake

[57] ABSTRACT

A method of producing foil in a coil relates to the art of applying coatings under vacuum and can prove to be most advantageous in producing foil from pure metals. The proposed method is characterized in that the foil is obtained by continuous condensation of metallic vapors under vacuum on a layer of antiadhesive, said layer being applied to the surface of a rotating substrata, this resulting in producing a metal layer - the foil, and in forming simultaneously a coil thereof, both said operations: the producing of the foil and forming the coil thereof being effected on one rotating substrata so that each next metal layer is being formed on an antiadhesive layer applied to the preceding metal layer. With the herein-proposed method the produced foil exhibits the same degree of reflectivity from both sides, and it is also possible for a coil to be formed while producing the foil which ensures an adequate quality of said foil.

2 Claims, 1 Drawing Figure

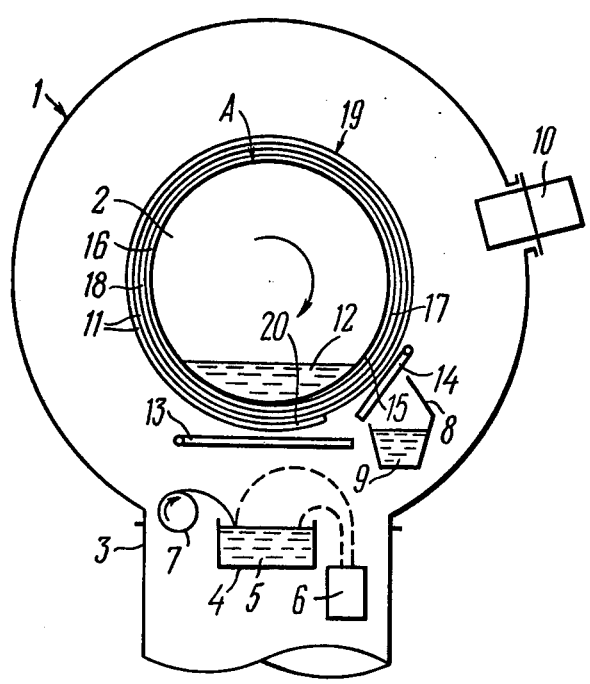

METHOD OF PRODUCING FOIL IN COILS

The present invention relates to the art of applying coatings by thermal evaporation and condensation of metallic vapours in a vacuum and more particularly to methods of producing foil in a coil. The present invention may prove to be most advantageous in producing foil from pure metals.

Known in the art are methods of producing foil in a coil (see, e.g., FRG Pat. No. 1143077, 1966. Cl. 48/04, MCI), wherein continuous condensation of metallic vapours is accomplished under vacuum on an antiadhesive layer applied to the surface of a revolving substrata, this resulting in producing a metal layer — the foil, with its separating and forming a coil.

Said prior-art method is effected in a vacuum chamber, wherein are mounted said rotating substrata which constitutes a drum, a device for applying an antiadhesive and a device for metallic vapours supply. The antiadhesive layer is applied to the drum surface and metallic vapours are condensed on said antiadhesive layer. As a result, a metal layer of a preset thickness — the foil is formed on the surface of said drum.

A device for separating the foil from the drum surface is installed outside the metal condensation zone in the direction of rotation of said drum. The foil, withdrawn from the chamber through a number of locks, is wound around a bobbin, that is set up near the chamber, forming thereby a coil.

The surfaces of the foil produced by said prior-art method differ in their total reflectivity. The foil surface facing the drum reproduces the microrelief of its ground surface.

As for the microrelief of the other foil surface facing the vaporizing device, it is dependent on metal volatilizing and metallic vapour condensing conditions (their condensation point, volatilization rate, an angle of incidence of a molecular beam on the drum surface and so forth) and differs in its nature from that of the surface presented to the drum.

In industry foil, e.g. of aluminum, has found favour for making plates of electric capacitors subjected in the course of fabrication to impregnation. In this case one of the major requirements imposed on the foil resides in that both its surfaces shall be identical in wettability, which is the function of the degree of identity of their microrelief. The lack of said identity in the microrelief of the foil surfaces and hence their different wettability adversely affects the quality of the capacitors.

The provision of such operations as the separation of a foil from the surface of a revolving drum, foil handling and its winding around the bobbin may lead to mechanical damage, distortion and crumpling of the foil surface, which deteriorates the quality of the foil. Mpreover, in case of foil breakage, the production process must be discontinued with the ensuing loss of vacuum in the chamber. All these factors impose a limitation on the production of foil featuring a minimum thickness and on the process efficiency in particular.

The main object of the present invention is the production of foil whose both surfaces are identical in terms of their microrelief.

Another object of the invention is to preclude the damaging of the foil surface and foil breakage which in turn provides a preset quality of the foil.

Still another object of the invention is to provide an enhancement of production rates while producing foil in a coil.

These and other objects are achieved by providing a method of producing foil in a coil, wherein continuous condensation of metallic vapours is being effected under vacuum on an antiadhesive layer applied to the surface of a rotating substrata, this resulting in producing a metal layer — the foil, and in forming a coil thereof. According to the present invention, with the above method the processes of producing foil and forming a coil thereof are carried out simultaneously on one rotating substrata coated with an antiadhesive layer so that each next metal layer is formed on an antiadhesive layer applied to the preceding metal layer.

Said method allows using as the substrata for condensation of the metallic vapours, a layer of the same metal of the already formed foil (with the exception of the first layer). The surface of each next metal layer facing a drum reproduces the surface microrelief of the previous metal layer presented to a vaporizing device, so that the two foil surfaces are identical in terms of their microrelief.

Moreover, the herein-proposed method makes it possible to eliminate the operation of separating the foil from the drum surface, precluding thereby mechanical damaging of the foil surface and its possible breakage, which would provide a preset quality of the foil, and afford the possibility of making foil practically of any minimum thickness and enhancing considerably the process efficiency.

The present invention will be better understood from a consideration of a detailed description of an examplary embodiment of the proposed method of producing foil in coils and a installation for effecting same, to be had in conjunction with the accompanying drawing which is a schematic view of an installation for producing foil in coils (a cross-sectional view).

The herein-proposed method of producing foil in coils resides in that continuous condensation of metallic vapours is being effected in a vacuum on an antiadhesive layer applied to the surface of a rotating substrata, this resulting in producing a metal layer — the foil, and in forming a coil thereof, the processes of producing the foil and making the coil thereof being carried out simultaneously on one rotating substrata coated with an antiadhesive layer so that each next layer of the metal is formed on an antiadhesive layer applied to the preceding metal layer.

The proposed method of producing foil in coils is realized in a known installation, comprising a chamber 1, wherein is mounted a power driven hollow drum 2 acting as a rotating substrata. The drum 2 has a horizontal shaft and is rotating clockwise (in the drawing plane).

In the bottom part of the chamber 1 runs a pipeline 3 through which said chamber 1 communicates with a vacuum system (not shown in the drawing). Here is also arranged a renewable crucible 4 wherein a metal 5 is melted and heated to its volatilization point by means of an electron-beam gun 6 that is disposed near the crucible 4, as shown in the drawing. A device 7 for replenishing the volatilizing metal 5 in the crucible 4 is located from the other side of said crucible 4 not far therefrom. In front of said crucible 4 in the direction of rotation of the drum 2 (in the drawing plane) is installed a device 8 adapted for feeding volatilizing antiadhesive 9 on a substrata. The body of the chamber 1 is fitted with a built-in pyrometer 10 for measuring the temperature at the surface of said substrata, which constitutes the surface "A" of said drum 2, and the temperature at the surface of a foil 11 formed thereon before applying a next layer of the antiadhesive 9 to said substrata. The interior of said drum 2 accommodates a fluid 12 (e.g., glycerin) adapted for stabilizing the temperature of the surface "A". Set up intermediate of the crucible 4 and drum 2 is a damper 13 and intermediate of the device 8 and drum 2 a damper 14.

The process of producing foil (e.g. of aluminum) in a coil is carried into effect in the following manner.

The surface "A" of the drum 2 is subjected to cleaning and degreasing. Next the renewable crucible 4 with the volatilized metal 5, e.g. aluminum pigs, is mounted in the chamber 1 and the device 7 for replenishing the volatilizing metal 5 is set up within the crucible 4. The metal 5 for replenishing purposes is shaped as a wire, and the device 7 is made as a reel around which said wire is wound. The device 8 is filled with any known antiadhesive 9 that is commonly used in producing aluminum foil 11.

Next the chamber 1 is evacuated, whereupon a drive (not shown in the drawing) of the drum 2 is put into service to impart the drum 2 a preset speed of rotation. Following that the drum 2 is heated to a preset temperature with the aid of heating devices (not shown in the drawing). At the same time the metal 5, enclosed in the renewable crucible 4, is heated by the electron-beam gun 6, with the damper 13 being arranged above the crucible 4. As soon as the temperature of the heated metal 5 approaches its volatilization point, the heating of the antiadhesive 9 in the device 8 is initiated, the damper 14 being located above the device 8.

Both the heating conditions of the drum 2 and those required for bringing the temperature of the metal 5 and antiadhesive 9 to their volatilization points are selected so that these points are attained essentially at the same time. Thus the setting of the installation for producing foil 11 for operation is brought to a close and the herein-proposed process is initiated.

The damper 14 is taken aside and the vapours of the antiadhesive 9 are condensed on the surface "A" of the rotating drum 2, i.e. on the rotating substrata, forming a layer 15. The antiadhesive 9 is selected so that its volatilization point is slightly higher than the preset temperature to which the surface "A" of the drum 2 is heated. At the instant the layer 15 of the antiadhesive 9, formed on the surface "A" of the drum 2, passes over the crucible 4, the damper 13 is taken aside. The vapours of the metal 5 heated in the renewable crucible 4 commence to be condensed on the layer 15 of the antiadhesive 9 and, as the drum 2 is rotating, a layer 16 of said metal 5 — the foil 11 is being formed on the drum surface "A." In this case the rate of volatilization of the metal 5 and the speed of rotation of the drum 2 are selected so as to provide a preset thickness of the produced foil 11. After the drum 2 has completed its revolution, a layer 17 of the antiadhesive 9 is formed by condensation of its vapours on the surface of the layer 16 of the metal 5 formed thereon. Next the vapours of the metal 5 settle on the layer 17 of the antiadhesive applied to the layer 16 of the metal 5, forming the next layer 18 of said metal 5, with the preceding layer 16 of the metal 5 acting in that case as the substrata. Thus, each next layer 18 of the metal 5 is formed on the layer 17 of the antiadhesive 9 applied to the preceding layer 16 of the metal 5, this resulting in the formation of a coil 19 of the foil 11. As the metal 5 enclosed in the renewable crucible 4 is being consumed, it is replenished by feeding the metal wire with the help of the device 7 for replenishing the volatilizing metal 5. As soon as the length of the foil 11 attains a preset value, the damper 14 returns to its initial position cutting off thereby the supply of the volatilized antiadhesive to the substrata. The device 8 is detached with the drum 2 being stopped simultaneously. As the drum 2 is rotating, the vapours of the metal 5 are being condensed on the substrata portion, located at this particular moment above the renewable crucible 4, in a slightly greater amount than on the remaining portion of said substrata. As a result, the end portion 20 of the foil 11 is being formed, the thickness of said portion 20 being 2 or 3 times as great as that of the remaining part of said foil 11, the separation of said end 20 of the foil 11 (while unwinding the coil 19 outside the chamber 1) being therefore rendered more convenient. Following that, the damper 13 is returned into its initial position to cut off the supply of the volatilized metal 5 to the substrata. Next the electron-beam gun 6 is switched off.

Thus, the cycle of producing the foil 11 in the form of the coil 19 is completed.

What we claim is:

1. A method of producing foil in a coil, said method comprising the steps of applying a layer of antiadhesive to the surface of a rotating substrata and condensing metallic vapours in a vacuum on said antiadhesive layer, this resulting in producing a metal layer — the foil, and in forming a coil thereof, both processes — the producing of the foil and forming the coil thereof being effected simultaneously on one rotating substrata coated with a layer of said antiadhesive so that each next metal layer is formed on the antiadhesive layer applied to the preceding metal layer.

2. A method as recited in claim 1 and wherein metal vapours are obtained by vaporizing a metal in a crucible, and replenishing the latter metal as it is consumed by feeding the metal in the form of a wire to said crucible.

* * * * *